(12) United States Patent
Ogawa

(10) Patent No.: US 6,380,584 B1
(45) Date of Patent: Apr. 30, 2002

(54) SEMICONDUCTOR MEMORY DEVICE WITH SINGLE AND DOUBLE SIDEWALL SPACERS

(75) Inventor: Takahiro Ogawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 2 days.

(21) Appl. No.: 09/587,187

(22) Filed: Jun. 5, 2000

(30) Foreign Application Priority Data

Aug. 3, 1999 (JP) ............................................ 11-219969

(51) Int. Cl.[7] .......................................... H01L 29/788
(52) U.S. Cl. ...................... 257/315; 257/316; 257/335; 257/336; 257/344; 438/201; 438/211; 438/257; 438/266
(58) Field of Search .................................. 257/315, 316, 257/335, 336, 344; 438/201, 211, 257, 266

(56) References Cited

U.S. PATENT DOCUMENTS 5,208,472 A * 5/1993 Su et al. ...................... 257/344
5,329,482 A * 7/1994 Nakajima et al. ............ 365/182
5,625,217 A * 4/1997 Chau et al. .................. 257/412

FOREIGN PATENT DOCUMENTS

| JP | 01292863 A | * 11/1989 | ........... H01L/29/78 |
| JP | 1-292863 | 11/1989 | ........... H01L/29/78 |
| JP | 07161848 A | * 6/1995 | ..... H01L/021/8247 |

* cited by examiner

Primary Examiner—Nathan Flynn
Assistant Examiner—Scott R Wilson
(74) Attorney, Agent, or Firm—Nixon & Vanderhye P.C.

(57) ABSTRACT

A process for manufacturing a semiconductor device including a plurality of transistors in each of a memory cell portion and a peripheral circuit portion formed on the same semiconductor substrate, comprising: (a) forming a gate of transistors in a peripheral circuit portion; (b) forming first sidewall spacers on sides of the gates; (c) forming a gate of transistors in a memory cell portion; (d) forming second sidewall spacers on sides of the gates in the peripheral circuit portion and the memory cell portion, so that single sidewall spacers are formed on the transistors in the memory cell portion and dual sidewall spacers are formed on the transistors in the peripheral circuit portion; and (e) forming source/drain regions in the peripheral circuit portion and the memory cell portion to obtain a plurality of transistors.

9 Claims, 4 Drawing Sheets

Fig. 1(a') 
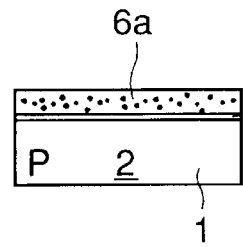
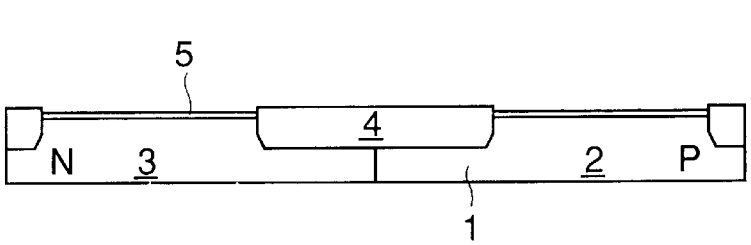
Fig. 1(b)
Fig. 1(b')
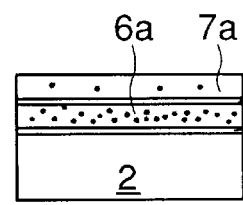
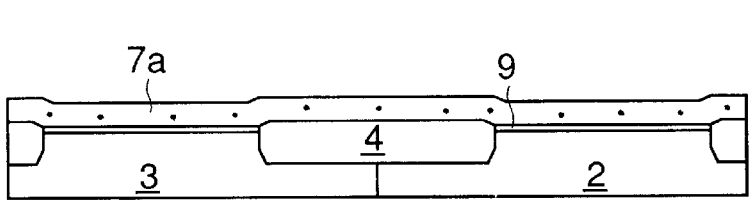
Fig. 1(c)
Fig. 1(c')
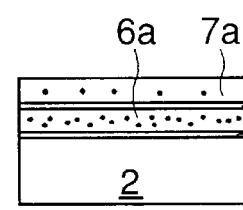
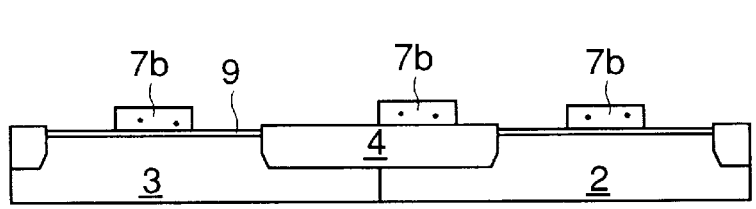
Fig. 1(d)
Fig. 1(d')
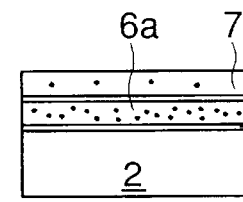
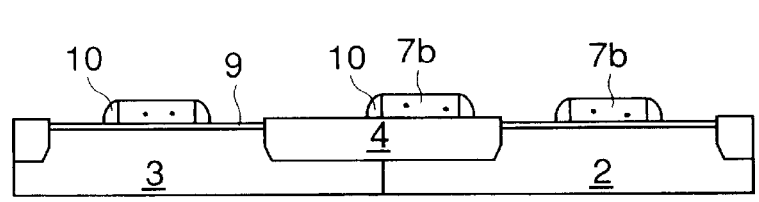

Fig. 1(e')
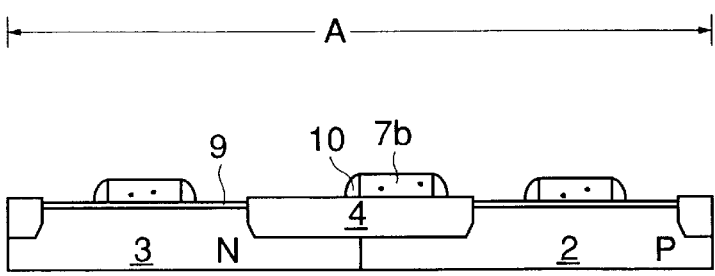
  Fig. 1(f')
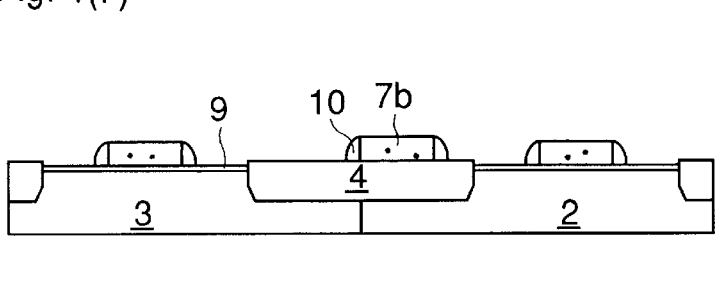
  Fig. 1(g')
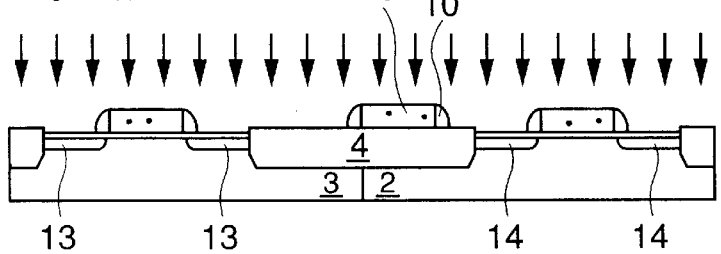
  Fig. 1(h')
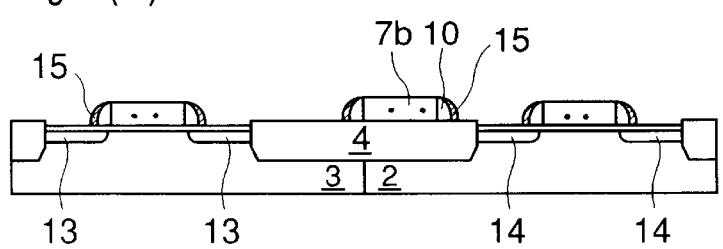
  Fig. 1(i')
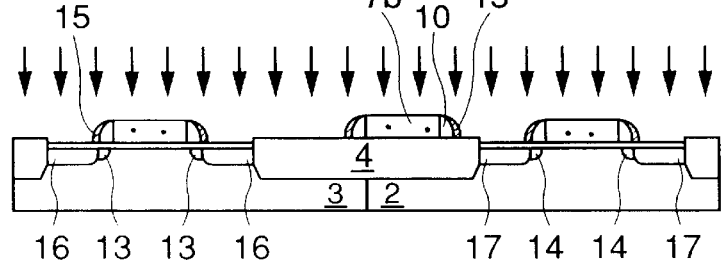

SEMICONDUCTOR MEMORY DEVICE WITH SINGLE AND DOUBLE SIDEWALL SPACERS

CROSS-REFERENCE TO RELATED APPLICATION

This application is related to Japanese application No. HEI 11(1999)-219969 filed on August 3rd, whose priority is claimed under 35 USC §119, the disclosure of which is incorporated by reference in its entirety.

BACKGROUND OF THE INVENTION

1. Field of the Invention

The present invention relates to a process for manufacturing a semiconductor device and a semiconductor device formed by the process. More particularly, it relates to a process for manufacturing a semiconductor device comprising a memory cell portion and a peripheral circuit portion in which a single sidewall spacer is provided on a gate of a transistor in the memory cell portion and a dual sidewall spacer is provided on a gate of a transistor in the peripheral circuit portion, and a semiconductor device formed by the process.

2. Description of Related Art

In recent years, high integration of semiconductor devices such as ICs and LSIs has been remarkable, and advanced miniaturization techniques are required.

For example, in MOS devices which have been used for various applications such as semiconductor memories, a plurality of gate electrodes are arranged on one well, so that space between the gate electrodes has been reduced smaller and smaller as the semiconductor devices have been miniaturized.

In such a semiconductor device, hot carriers are generated by a high electric field and penetrate into a gate oxide film of the semiconductor device, which deteriorates transistor characteristics. To prevent the deterioration caused by the hot carriers, has been proposed a method for providing sidewalls on the sides of a polysilicon gate on the gate oxide film and forming an LDD (Lightly Doped Drain) structure in the neighborhood of a drain below the sidewalls to alleviate the electric field in this region.

Among the semiconductor memories, non-volatile flash memories are capable of writing and reading at any time.

The flash memory is constituted of transistors formed both in a memory cell portion and in a peripheral circuit portion on a p-type silicon substrate 1 as shown in FIG. 3(a) for the memory cell portion and FIG. 3(b) for the peripheral circuit portion. The transistors are connected to a wiring layer formed thereon through contact plugs.

In this flash memory, data writing is performed by applying a high electric field to a drain region of an $n^+$ layer 11 and a control gate 7 and injecting electric charges to a floating gate 6 through a tunnel oxide film 5. Data erasing is performed by applying a positive electric field to the $n^+$ layer 11 and a source region of an $n^-$ layer 12 and applying a negative electric field to the control gate 7 so that the electric charges are drawn to the source region.

In non-volatile semiconductor memory devices such as the flash memories, the memory cell portion has to be highly integrated and miniaturized, while the transistor of the peripheral circuit portion must satisfy a strict requirement in dielectric strength.

Typically, in the above semiconductor devices, the transistors in the peripheral circuit portion and in the memory cell portion are formed simultaneously with a view to simplifying the manufacturing process. Accordingly, sidewalls for the gates of the transistors are also formed in one operation. The sidewalls of the transistor in the peripheral circuit portion are formed thick to meet the strict dielectric strength requirement, and therefore the sidewalls of the transistor in the memory cell portion are also thickened.

However, where the device is integrated higher and the space between the gates becomes narrower, the thick sidewalls on the gate of the transistor in the memory cell portion make it difficult to connect the contact plug to the source/drain region as shown in FIG. 3(a). Therefore, there have been demanded, not only the miniaturization and the high integration of the semiconductor devices, but also secure connection between the contact plug and the source/drain region.

SUMMARY OF THE INVENTION

The present invention has been achieved to solve the above drawbacks, and intended to provide a process for manufacturing a semiconductor device which allows thinner sidewalls on the transistor in the memory cell portion as compared with the sidewalls of the transistor in the peripheral circuit portion is required to exhibit the strict insulation resistance, and a semiconductor device formed by the process.

According to the present invention, provided is a process for manufacturing a semiconductor device including a plurality of transistors in each of a memory cell portion and a peripheral circuit portion formed on the same semiconductor substrate, comprising: (a) forming gates of transistors in a peripheral circuit portion; (b) forming first sidewall spacers on sides of the gates; (c) forming gates of transistors in a memory cell portion; (d) forming second sidewall spacers on sides of the gates in the peripheral circuit portion and the memory cell portion, so that singl sidewall spacers are formed on the transistors in the memory cell portion and dual sidewall spacers are formed on the transistors in the peripheral circuit portion; and (e) forming source/drain regions in the peripheral circuit portion and the memory cell portion to obtain a plurality of transistors.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1(a) to 1(i) and 1(a') to 1(i') are schematic sectional views of major parts illustrating an example of a process for manufacturing a semiconductor device according to the present invention;

DESCRIPTION OF THE PREFERRED EMBODIMENTS

Figure 1A:

In a process for manufacturing a semiconductor device according to the present invention, first, a memory cell portion and a peripheral circuit portion are defined on the same semiconductor substrate and at least one impurity region (well), a device isolation film, an oxide film and the like are formed.

A silicon substrate is used as the semiconductor substrate. The impurity region may be formed in the semiconductor substrate by a known method such as ion implantation, thermal diffusion or the like to have a desired impurity concentration of p-type or n-type. The device isolation film may be formed by suitably selecting a known method such as LOCOS method, device isolation method using trenches or the like. The oxide film is preferably formed thin by a known method such as thermal oxidization, CVD method or the like to have a relatively small thickness, i.e., the oxide film is preferably formed into a thin film which can be used as a gate oxide film or a tunnel oxide film of a transistor in the memory cell portion.

In the step (a), a gate of a transistor is formed in the peripheral circuit portion on the semiconductor substrate obtained as described above. The gate is not particularly limited as long as it is made of such a material of such a thickness as commonly used for a gate electrode of a semiconductor device. For example, the gate may be formed of a single layer of polysilicon and a high melting point metal such as titanium or tungsten, or a multi layer thereof such as a silicide and polycide. The thickness is about 1500 to 3500 Å, for example. Generally, the gate can be formed by depositing a film of the above material on the entire surface of the semiconductor substrate by sputtering, CVD method, vapor deposition or the like and patterning it into a desired configuration by photolithography and etching technique.

At the formation of the gate in the peripheral circuit portion, a film of the gate material is also formed on the memory cell portion. This gate material film can be kept remaining on the entire memory cell portion by covering it with a mask for patterning the gate material film of the peripheral circuit portion. The remaining gate material film can be used in a later step as a material for the transistor gate of the memory cell portion.

In the step (b), first sidewall spacers are formed on sides of the transistor gate in the peripheral circuit portion. The sidewall spacer can be forming by depositing an insulating film on the entire surface of the semiconductor substrate where the gate has been formed and then etching back the resulting entire surface. Examples of the insulating film constituting the sidewall spacer include, for example, a silicon oxide film, a silicon nitride film and a laminated film thereof. The insulating film needs to be formed in a thickness such that the first sidewall spacer and the second sidewall spacer formed in the step (d) described later have a total width which can ensure dielectric strength in the peripheral circuit portion against an operating voltage. For example, the insulating film may be formed into about 1500 to 2000 Å thick, though it varies depending on the thickness of an insulating film for forming the second sidewall spacer in the step (d). Thus, the sidewall spacers of about 1000 to 1500 Å width can be formed on the semiconductor substrate.

The insulating film for forming the first sidewall spacers is also formed on the memory cell portion. In the memory cell portion, the gate material film has been formed on the entire surface and the surface is flat throughout the portion. Therefore the insulating film can be entirely removed from the memory cell portion by etching back for forming the sidewall spacers, which can thus be formed only on the gate of the peripheral circuit portion.

In the step (c), a gate is formed on the memory cell portion. The gate can be formed by patterning the gate material film, which has been formed in the step (a) and remained on the memory cell portion, into a desired configuration in the same manner as the above. In the memory cell portion, only the gate material film may be patterned into the gate. However, preferably, before the step (a), a film of a material for a floating gate is formed into a desired shape and an insulating film is formed on the material film, and the gate material film are patterned to form a gate electrode of a flash memory cell structure in the step (c). The material film for the floating gate formed in advance may be suitably selected from the gate material films mentioned in the step (a). The thickness of the material film for the floating gate may be about 1000 to 1500 Å, for example. The insulating film on the material film is preferably formed of a silicon oxide film, a silicon nitride film or a laminated film thereof into a thickness of about 100 to 200 Å. The material film for the floating gate is preferably formed on the entire surface of the semiconductor substrate, and using a desired mask, removed from the peripheral circuit portion and patterned into a desired configuration on the memory cell portion. Thus, in the step (c), the gate of the flash memory cell structure in which a control gate is arranged on the floating gate with intervention of the insulating film can be formed.

In the step (d), second sidewall spacers are formed on the sides of the gates of the peripheral circuit portion and the memory cell portion. In the peripheral circuit portion, the first sidewall spacers have been formed on the sides of the gate. Therefore in this step, the second sidewall spacers are formed on the first sidewall spacers, so that a dual sidewall spacer structure is provided. In the memory cell portion, only the second sidewall spacers are formed on the sides of the floating gate and the control gate. An insulating film for forming the sidewall spacers may be a silicon oxide film, a silicon nitride film or a laminated film thereof, but the silicon nitride film is preferable. The thickness of the insulating film can be suitably selected in view of a degree of the integration of the memory cell, that is, a distance between the gates, and a contact area or a contact resistance between a wiring layer and the semiconductor substrate. It may be about 500 to 1000 Å, for example. The second sidewall spacers can be formed in the same manner as in the step (b).

In the step (e), source/drain regions of the memory cell portion and of the peripheral circuit portion are formed. The source/drain regions can be formed by suitably selecting a known method such as ion implantation for manufacturing semiconductor devices. The source/drain regions of the memory cell portion and the peripheral circuit portion may be formed as LDD, DDD, asymmetric LDD or DDD structure. Incidentally, the source/drain regions can be formed before, after and/or between the above steps (a) to (d) as required.

In the process for manufacturing the semiconductor device according to the present invention, an interlayer insulating film, a contact hole, a contact plug, a wiring layer and the like are formed in combination in optional steps before, after or between the above steps as required in the memory cell portion and the peripheral circuit portion. Thus, a plurality of transistors have been formed in each of the memory cell portion and a peripheral circuit portion on the same semiconductor substrate.

Hereinafter, an example of the process for manufacturing a semiconductor device and a semiconductor device formed by the process will be explained with reference to FIGS. 1(*a*) to 1(*i*), 1(*a'*) to 1(*i'*). FIGS. 1(*a*) to 1(*i*) illustrates a memory cell portion M and FIGS. 1(*a'*) to 1(*i'*) illustrates a peripheral circuit portion A.

First, as shown in FIGS. 1(a) and 1(a'), a p-type impurity and an n-type impurity are individually injected to a p-type silicon substrate 1 in which a device isolation region 4 is formed in a peripheral circuit portion A and a tunnel oxide film 5 of about 100 Å thick is formed in a memory cell portion M and the peripheral circuit portion A using a predetermined mask pattern, thereby a p⁻ well 2 and n⁻ well 3 are formed in the silicon substrate 1. Then, a polysilicon film of about 1200 to 1500 Å thick is formed on the entire surface of the silicon substrate 1 and patterned to form a floating gate 6a on the tunnel oxide film 5 in the memory cell portion M using a predetermined mask pattern.

Next, as shown in FIGS. 1(b) and 1(b'), an ONO film 8 having thicknesses of about 40 Å/70 Å/70 Å is formed on the floating gate 6a in the memory cell portion M and a gate oxide film 9 is formed on the peripheral circuit portion A. Then, a polysilicon film 7a of about 2000 to 3000 Å thick is formed on the entire surfaces of the ONO film 8 and the gate oxide film 9.

Then, as shown in FIGS. 1(c) and 1(c'), the polysilicon film 7a only in the peripheral circuit portion A is patterned to form a gate electrode 7b.

Next, as shown in FIGS. 1(d) and 1(d'), an HTO film of about 1500 to 2000 Å thick is formed on the entire surface of the silicon substrate 1 and anisotropically etched back to form sidewall spacers 10 on the sides of the gate electrode 7b of the peripheral circuit portion A. The sidewall spacers 10 are about 1000 to 1500 Å thick where it contacts the silicon substrate 1.

Figure 1E:

Then, as shown in FIGS. 1(e) and 1(e'), only in the memory cell portion M, the tunnel oxide film 5, the floating gate 6a, the ONO film 8 and the polysilicon film 7a are successively patterned to form a floating gate 6 and a control gate 7.

Figure 1F:
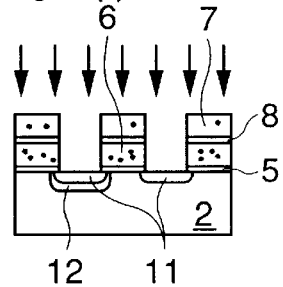

Then, as shown in FIGS. 1(f) and 1(f'), an n⁻ layer 12 is formed in a source region of the memory cell portion M using a resist (not shown) as a mask to cover the peripheral circuit portion A and a drain region of the memory cell portion M, and an n⁺ layer 11 is formed while masking the peripheral circuit portion A with a resist. Thus, a double diffusion layer of the n⁻ layer 12 and the n⁺ layer 11 is formed in the source region and the n⁺ layer 11 is formed in the drain region.

Figure 1G:
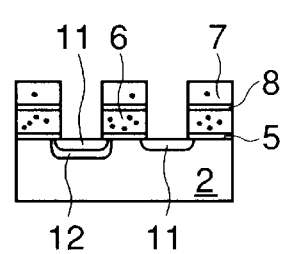

Subsequently, as shown in FIGS. 1(g) and 1(g'), an n⁻ layer 14 is formed in the p⁻ well 2 of the peripheral circuit portion A using a resist (not shown) as a mask to cover the memory cell portion M and the n⁻ well 3 of the peripheral circuit portion A, and a p⁻ layer 13 is formed in the n⁻ well 3 while masking the memory cell portion M and the p⁻ well 2 of the peripheral circuit portion A with a resist.

Figure 1H:
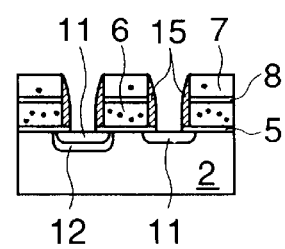

Next, as shown in FIGS. 1(h) and 1(h'), a SiN film of about 1000 to 1500 Å thick is formed on the entire surface of the silicon substrate 1 and anisotropically etched back to form sidewall spacers 15 on the sides of the floating gate 6 and the control gate 7 in the memory cell portion M, and to form dual sidewalls constituted of sidewall spacers 10 made of the HTO film and the sidewall spacers 15 made of the SiN film on the sides of the gate electrode 7b in the peripheral circuit portion A. The sidewall spacers made of the SiN film is about 500 to 1000 Å thick where it contacts the silicon substrate 1.

Figure 1I:
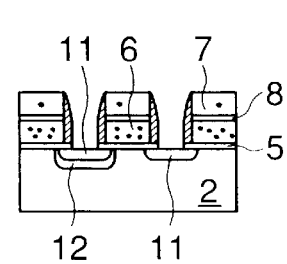

Then, as shown in FIGS. 1(i) and 1(i'), an n⁺ layer 17 is formed in the p⁻ well 2 of the peripheral circuit portion A using a resist (not shown) as a mask to cover the memory cell portion M and the n⁻ well 3 of the peripheral circuit portion A, and a p⁺ layer 16 is formed in the n⁻ well 3 while masking the memory cell portion M and the p⁻ well 2 of the peripheral circuit portion A. Thus, source/drain regions of LDD structure are formed.

Figures 2A, 2B:
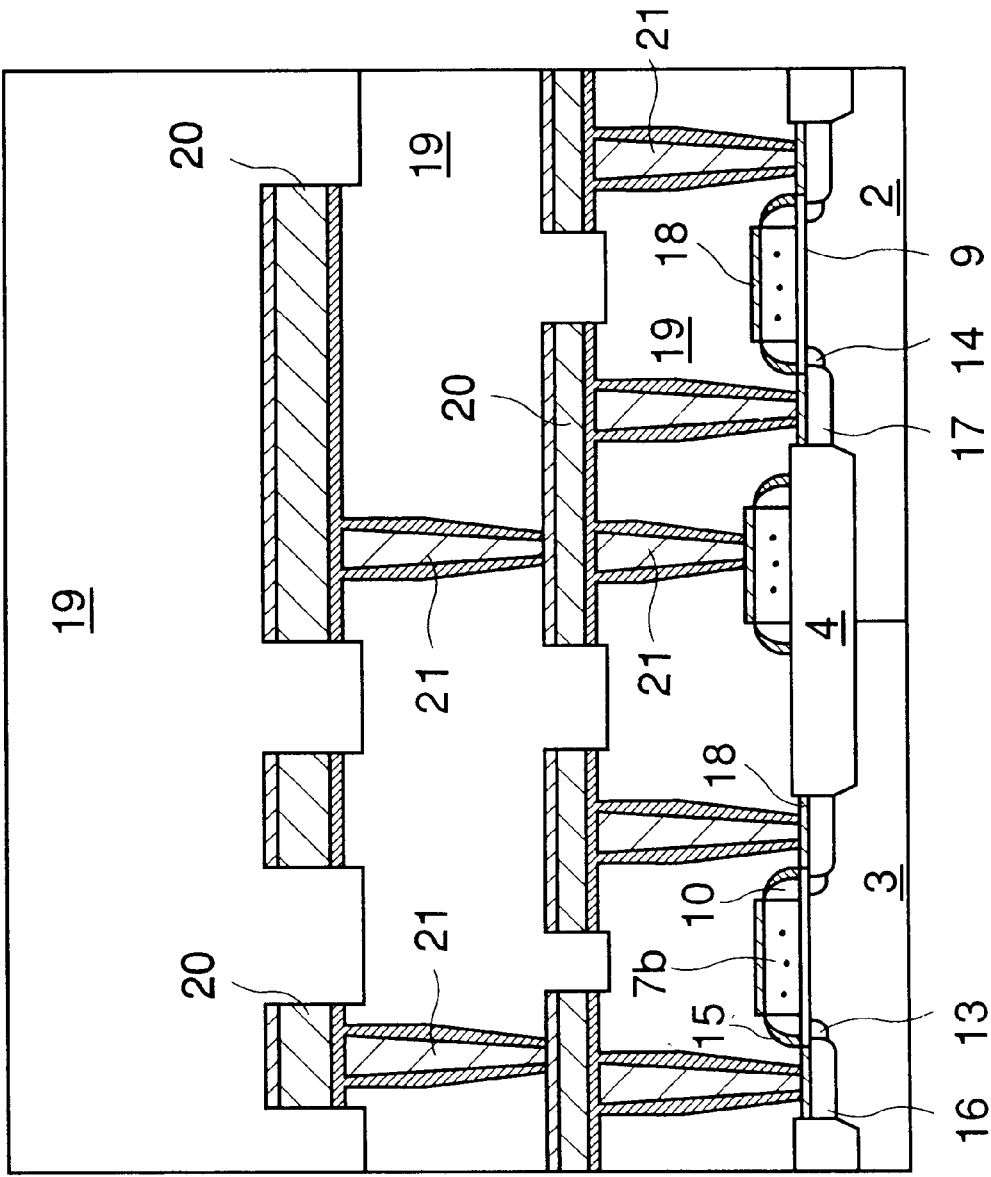
FIGS. 2(a) and 2(b) are schematic sectional views illustrating major parts of a semiconductor device formed by the process for manufacturing the semiconductor device according to the present invention.
Figure 3B:
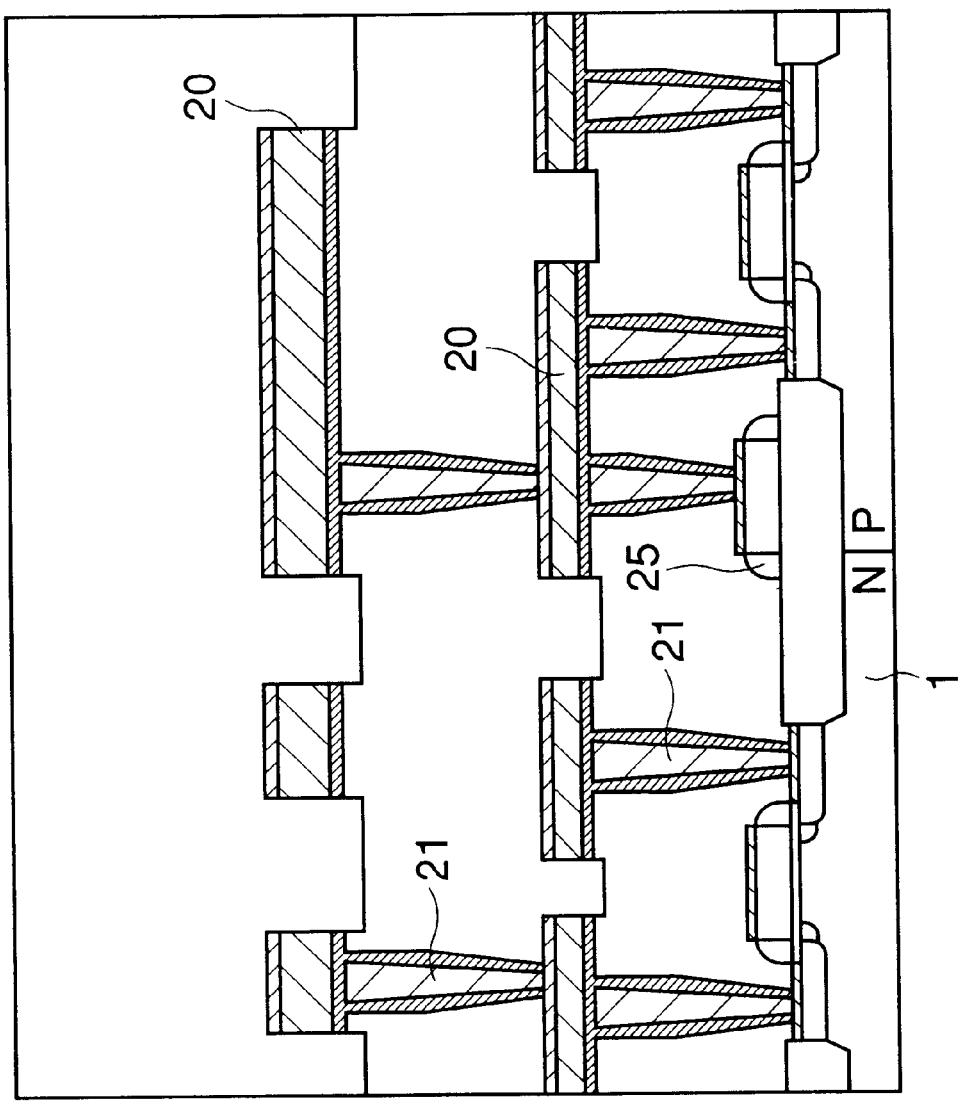
FIGS. 3(a) and 3(b) are schematic sectional views of major parts illustrating an example of a conventional process for manufacturing a semiconductor device.
Figure 3A:
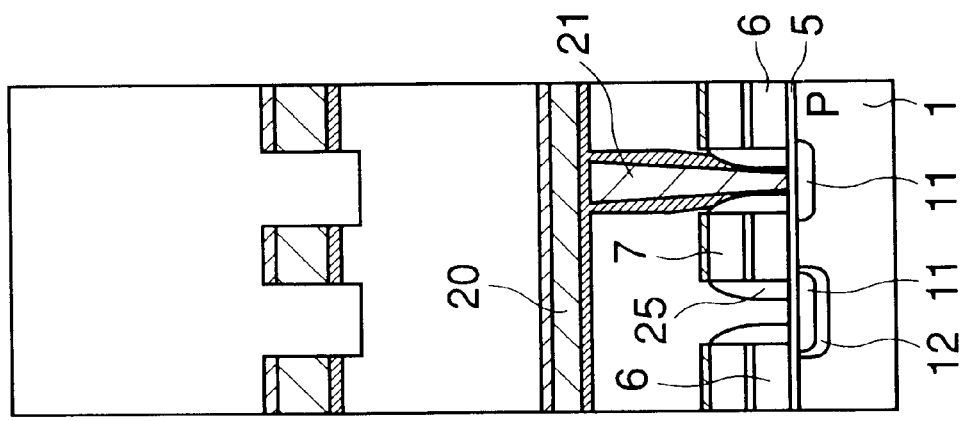

Thereafter, in both the memory cell portion M and the peripheral circuit portion A, the control gate 7 and the gate electrode 7b are formed and a titanium silicide 18 is formed on the source/drain region. Then, an interlayer insulating film 19, a contact hole, a contact plug 20 and a wiring layer 21 are formed. By repeating the formation of them, a non-volatile semiconductor memory as shown in FIGS. 2(a) and 2(b) is completed.

According to the above process, the sidewall spacers can be by far thinner in the memory cell portion M than in the peripheral circuit portion A. Therefore a distance between the transistor and the wiring layer 21 of the memory cell portion M can be reduced, thereby allowing to make a cell area small.

Further, in this example, there is no particular need to mask the peripheral circuit portion A because only processes for forming the HTO film to form the first sidewall spacers and for etch backing are added. Therefore, the number of masks used does not increase as compared with a conventional process.

According to the process for manufacturing a semiconductor device of the present invention, transistors in the peripheral circuit portion and in the memory cell portion can be formed simultaneously without increasing any particular masking steps. Further, the sidewalls of the transistor in the peripheral circuit portion are formed thick to secure a strict insulation resistance while the high integration and miniaturization of the memory cell portion can be realized.

Further, where a silicon nitride film is used as the second sidewall spacers, the sides of the gate can be surely protected when a contact hole is opened in the memory cell portion after the interlayer insulating film 19 is formed, whereas, the sidewall spacers made of an oxide film may possibly expose the sides of the gate.

What is claimed is:

1. A semiconductor device comprising:
    a plurality of transistors provided in each of a memory cell portion and a peripheral circuit portion on the same semiconductor substrate,
    wherein gates of the transistors in the memory cell portion have only a single sidewall spacer of a silicon nitride film and gates of the transistors in the peripheral circuit portion have dual sidewall spacers in which first sidewall spacers of the silicon nitride film are formed outside an interior sidewall spacer layer.

2. A semiconductor device according to claim 1, wherein the memory cell portion and the peripheral circuit portion have source/drain regions of LDD, DDD, asymmetric LDD or DDD structure.

3. The semiconductor device of claim 1, wherein the peripheral circuit portion comprises an LDD structure, and a low-concentration region of the LDD structure and a high-concentration region are arranged in self-alignment with the interior sidewall spacer layer and the silicon nitride sidewall spacer, respectively.

4. A semiconductor memory device comprising:
    a plurality of transistors formed in a memory cell portion and a peripheral circuit portion of the memory device on the same substrate, wherein each of said transistors includes a gate; and
    wherein at least one transistor gate in the memory cell portion of the memory device includes a gate sidewall of only one gate sidewall layer, and at least one transistor gate in the peripheral circuit portion of the memory device includes a multi-layer gate sidewall including both said one gate sidewall layer and an additional gate sidewall layer.

5. The memory device of claim 4, wherein for said gate in the peripheral circuit portion of the memory device, said additional gate sidewall layer is formed prior to and located interior said one gate sidewall layer.

6. The memory device of claim 5, wherein said one gate sidewall layer comprises silicon nitride.

7. The memory device of claim 6, wherein said additional gate sidewall layer comprises at least an oxide.

8. The memory device of claim 4, wherein the memory cell portion and the peripheral circuit portion have source/drain regions of LDD, DDD, asymmetric LDD or DDD structure.

9. The memory device of claim 1, wherein the peripheral circuit portion comprises an LDD structure, and a low-concentration region of the LDD structure and a high-concentration region are arranged in self-alignment with the additional gate sidewall layer and the one gate sidewall layer, respectively.

* * * * *